United States Patent
Wood et al.

[19]

[11] Patent Number: 6,091,251
[45] Date of Patent: *Jul. 18, 2000

[54] DISCRETE DIE BURN-IN FOR NONPACKAGED DIE

[76] Inventors: Alan G. Wood, 2222 White Pine Pl., Boise, Id. 83706; Tim J. Corbett, 11629 Hidden Valley Rim Rd., Boise, Id. 83709; Gary L. Chadwick, 1321 E. Jefferson, Boise, Id. 83712; Chender Huang, 2578 Waterbury La., Boise, Id. 83706; Larry D. Kinsman, 7345 Cascade Dr., Boise, Id. 83704

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/888,448

[22] Filed: Jul. 7, 1997

Related U.S. Application Data

[63] Continuation of application No. 08/639,509, Apr. 29, 1996, abandoned, which is a continuation of application No. 08/410,890, Mar. 27, 1995, abandoned, which is a division of application No. 08/192,023, Feb. 3, 1994, which is a division of application No. 07/973,931, Nov. 10, 1992, Pat. No. 5,302,891, which is a continuation of application No. 07/709,858, Jun. 4, 1991, abandoned.

[51] Int. Cl.[7] ............................. G01R 1/073; G01R 31/28
[52] U.S. Cl. ............................................. 324/755; 324/765
[58] Field of Search .................................... 324/755, 754, 324/765, 758, 760; 439/68

[56] References Cited

U.S. PATENT DOCUMENTS

| | | | |
|---|---|---|---|
| 4,169,642 | 10/1979 | Mouissie ................................... | 439/68 |
| 4,585,991 | 4/1986 | Reid ......................................... | 324/757 |
| 4,783,719 | 11/1988 | Jamison et al. ........................... | 439/68 |
| 4,891,585 | 1/1990 | Janko et al. .............................. | 324/754 |
| 4,899,107 | 2/1990 | Corbett et al. ........................... | 324/765 |
| 4,906,920 | 3/1990 | Huff et al. ................................ | 324/754 |
| 4,912,399 | 3/1990 | Greub et al. ............................. | 324/754 |
| 4,918,383 | 4/1990 | Huff et al. ................................ | 324/754 |
| 4,968,931 | 11/1990 | Littlebury et al. ....................... | 324/760 |
| 5,014,161 | 5/1991 | Lee et al. ................................. | 324/754 |
| 5,072,289 | 12/1991 | Sugimoto et al. ........................ | 357/68 |
| 5,073,117 | 12/1991 | Malhi et al. .............................. | 439/71 |
| 5,088,190 | 2/1992 | Malhi et al. .............................. | 29/843 |
| 5,117,439 | 5/1992 | Liu et al. ................................. | 324/765 |
| 5,123,850 | 6/1992 | Elder et al. .............................. | 439/67 |
| 5,180,977 | 1/1993 | Huff ......................................... | 324/754 |
| 5,225,037 | 7/1993 | Elder et al. .............................. | 156/644 |
| 5,302,891 | 4/1994 | Wood et al. .............................. | 324/765 |
| 5,543,725 | 8/1996 | Lim et al. ................................. | 324/755 |
| 5,815,000 | 9/1998 | Farnworth et al. . | |
| 5,825,195 | 10/1998 | Hembree et al. . | |
| 5,878,485 | 3/1999 | Wood et al. . | |
| 5,896,036 | 4/1999 | Wood et al. . | |
| 5,949,242 | 9/1999 | Wood et al. . | |

FOREIGN PATENT DOCUMENTS 3-69131   3/1991   Japan .

OTHER PUBLICATIONS

"Decal Contractor With Decoder", #32636, Research Disclosure, No. 326, Jun. 1991.

Yamamoto et al., "Evaluation of New–Micro Connection Ssystem Using Microbumps", ISHM '93 Proceedings.

Miyake et al, Connectivity Analysis of New 'Known Good Die' Connection System Using Microbumps, Jan., 1994.

*Primary Examiner*—Ernest Karlsen
*Attorney, Agent, or Firm*—Stephen A. Gratton

[57] ABSTRACT

A reusable burn-in/test fixture for discrete TAB die consists of two halves. The first half of the test fixture contains cavity in which die is inserted. When the two halves are assembled, the fixture establishes electrical contact with the die and with a burn-in oven. The test fixture need not be opened until the burn-in and electrical test are completed. The fixture permits the die to be characterized prior to assembly.

10 Claims, 8 Drawing Sheets

DISCRETE DIE BURN-IN FOR NONPACKAGED DIE

CROSS REFERENCE TO RELATED APPLICATIONS

This application is a continuation of application Ser. No. 08/639,509 filed Apr. 29, 1996, abandoned, which is a continuation of application Ser. No. 08/410,890 filed Mar. 27, 1995, abandoned, which is a division of application Ser. No. 08/192,023 filed Feb. 3, 1994, pending, which is a division of application Ser. No. 07/973,931 filed Nov. 10, 1992, U.S. Pat. No. 5,302,891, which is a continuation of application Ser. No. 07/709,858 filed Jun. 4, 1991, abandoned.

FIELD OF THE INVENTION

This invention relates to electrical test equipment for semiconductor devices. More specifically, the invention relates to an apparatus and method to perform dynamic burn-in and full electrical/performance/speed testing on discrete nonpackaged or semi-packaged dice.

BACKGROUND OF THE INVENTION

Semiconductor devices are subjected to a series of test procedures in order to assure quality and reliability. This testing procedure conventionally includes "probe testing", in which individual dice, while still on a wafer, are initially tested to determine functionality and speed. Probe cards are used to electrically test die at that level. The electrical connection interfaces with only a single die at a time in wafer; not discrete die.

If the wafer has a yield of functional dice which indicates that quality of the functional dice is likely to be good, each individual die is assembled in a package to form a semiconductor device. Conventionally, the packaging includes a lead frame and a plastic or ceramic housing.

The packaged devices are then subjected to another series of tests, which include burn-in and discrete testing. Discrete testing permits the devices to be tested for speed and for errors which may occur after assembly and after burn-in. Burn-in accelerates failure mechanisms by electrically exercising the devices (UUT) at elevated temperatures, thus eliminating potential failures which would not otherwise be apparent at nominal test conditions.

Variations on these procedures permit devices assembled onto circuit arrangements, such as memory boards, to be burned-in, along with the memory board in order to assure reliability of the circuit, as populated with devices. This closed assembly testing assumes that the devices are discretely packaged in order that it can then be performed more readily.

It is proposed that multiple integrated circuit devices be packaged as a single unit. This can be accomplished with or without conventional lead frames. This creates two problems for being conventional test methods. Firstly, discrete testing is more difficult because the conventional lead frame package is not used. Furthermore, when multiple devices are assembled into a single package, the performance of the package is reduced to that of the die with the lowest performance. In other words, the ability to presort the individual dice is limited that obtained through probe testing. Secondly, the packaging may have other limitations which are aggravated by burn-in stress conditions so that the packaging becomes a limitation for burn-in testing.

A form of hybrid integrated circuit incorporates a plurality of dice in a single package. This increases density of packaging and permits matched components on different dice to be packaged as a single part. The yield rate of such an assembly is likely to be at least a multiple of the yield rates of its component dice. As mentioned, if performance of the dice is factored in, the yield is likely to become significantly lower than the multiple of the component yield rates.

On the other hand, if the test results of burned in dice are available, the component yield rates can be increased. It is further possible to match components by matching various characterizations (such as signal timing and response times), thereby providing more margin for proper response.

Such hybrid integrated circuits, as well as other configurations establish a need for burned in semiconductor dice. Ideally, it would be desirable to permit testing of individual dice in a manner similar to that accomplished with discrete packaged semiconductor devices.

In U.S. Pat. No. 4,899,107, commonly assigned, a reusable burn-in/test fixture for discrete TAB die is provided. The fixture consists of two halves, one of which is a die cavity plate for receiving semiconductor dice as the units under test (UUT); and the other half establishes electrical contact with the dice and with a burn-in oven The first half of the test fixture contains cavities in which die are inserted circuit side up. The die will rest on a floating platform. The second half has a rigid high temperature rated substrate, on which are mounted probes for each corresponding die pad. Each of a plurality of probes is connected to an electrical trace on the substrate (similar to a P.C. board) so that each die pad of each die is electrically isolated from one another for high speed functional testing purposes. The probe tips are arranged in an array to accommodate eight or sixteen dice.

The two halves of the test fixture are joined so that each pad on each die aligns with a corresponding probe tip. The test fixture is configured to house groups of 8 or 16 die for maximum efficiency of the functional testers.

There are some testing and related procedures when the parts are singulated. For this reason, it is inconvenient to retain multiple die in a single test fixture.

TAB tape is normally bonded at bondpads in order to establish electrical connections which exhibits long term reliability without requiring that external pressure be applied to the assembly. The bonding of the TAB tape establishes a mechanical connection which can cause the bond pads to lift off of (become detached from) the die when the TAB tape is removed.

The bondpads are conductive areas on the face of the die which are used as an interconnect for connecting the circuitry on the die to the outside world. Normally, conductors are bonded to the bondpads, but it is possible to establish electrical contact through the bondpads by biasing conductors against the bondpads without actual bonding.

SUMMARY OF THE INVENTION

It has been found desireable to perform testing and related procedures in discrete fixtures prior to final assembly. In order to accomplish this, a two piece reusable burn-in/test fixture for discrete die is provided. The fixture consists of two halves, one of which is a die cavity plate for receiving a semiconductor die as the units under test (UUT).

In a first embodiment, a die is placed face up in a cavity in a first half of the fixture. A die contact member is used to establish contact with bondpads on the die, and to conduct between the bondpads and external connector leads on the fixture.

The contact between the bondpads and the external connector leads is preferably established by utilizing non-bonded TAB (tape automated bonding) technology. Conductors on the non-bonded TAB tape extend from the bondpads to connection points, and the connection points conduct to contacts, which are in turn in communication with the external connector leads.

The non-bonded TAB tape is essentially similar to conventional TAB interconnect methods, except that its connection function may be performed without permanently bonding the TAB tape to the die. In order to maintain contact with circuitry on the die, the non-bonded TAB tape is biased against the die when the burn-in/test fixture is assembled. The non-bonded contact of the non-bonded TAB tape applies primarily to the die pads. Contact between the tape and other conductors may also be non-bonded contact, although the attachment of the TAB tape to the fixture may be effected either without permanent bonding, or by bonding techniques. The non-bonded TAB tape is biased against the die, preferably by a compressible elastomeric pad.

In the preferred form of that embodiment, the external connector leads are connector pins, which preferably are in a DIP (dual inline plug) or QFP (quad flat pack) configuration. The pins terminate as the connection points.

In an alternate form of that embodiment, the conductors on the non-bonded TAB tape conduct to the top of the tape, and attachment of the second half of the fixture establishes an electrical connection between the conductors and the external connection leads, either through the second half or through a separate conductor.

The fixture establishes electrical contact with the a single die and with a burn-in oven, as well as permitting testing of dice in discretely packaged form.

In another embodiment of the invention, a two piece reusable burn-in/test fixture for discrete die is provided. The first half of the test fixture contains a cavity in which a die is inserted circuit side up. The die will rest on a floating platform. The second half has a probe for each die pad. Each probe is connected to an electrical connector which can be used for attachment to a burn-in board and may be used for connection to a discrete circuit tester.

The probes can take several forms. Deposited conductors would be similar to the use of non-bonded TAB tape, except that the deposited conductors could be located on a fixed substrate. Conductive elastomers may be used, in which the conductive elastomer is used to establish electrical communication between the die, at the bondpads, and the external connection leads. Biased metal probes, such as probe wires, may be used.

In a third embodiment, the die is placed face up in a cavity in a first half of the fixture. A second half of the fixture includes external connector leads and is used to establish contact with bondpads on the die. Attachment of the die to the external connection leads is established either through contact points on the second half, or through an intermediate member, such as a non-bonded TAB tape.

In a fourth embodiment, the die is placed face down in a fixture which includes die receiving cavity. Contact with bondpads on the die are established in order that the bondpads are in electrical communication with external connector leads on the fixture.

In that embodiment, the probes and the electrical connector are located on the second half. In the preferred form of that embodiment, the electrical connector extends upward from the face of the circuit side of the die, so that the fixture is normally connected to a tester with the integrated circuit side of the die facing down.

DETAILED DESCRIPTION OF THE PREFERRED EMBODIMENT

Figure 1:
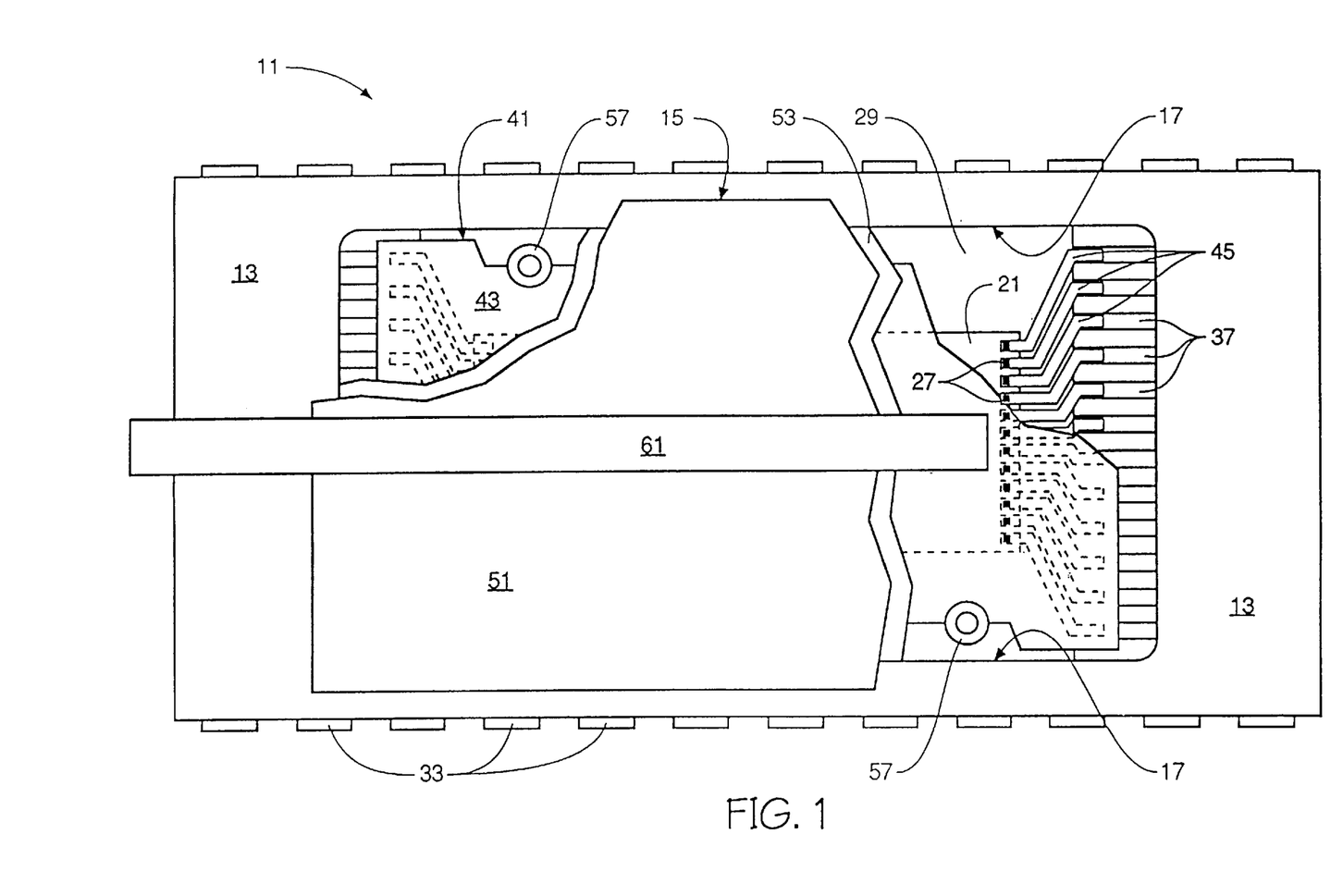
FIGS. 1 and 2 show a preferred embodiment of the inventive burn-in fixture.
Figure 2:
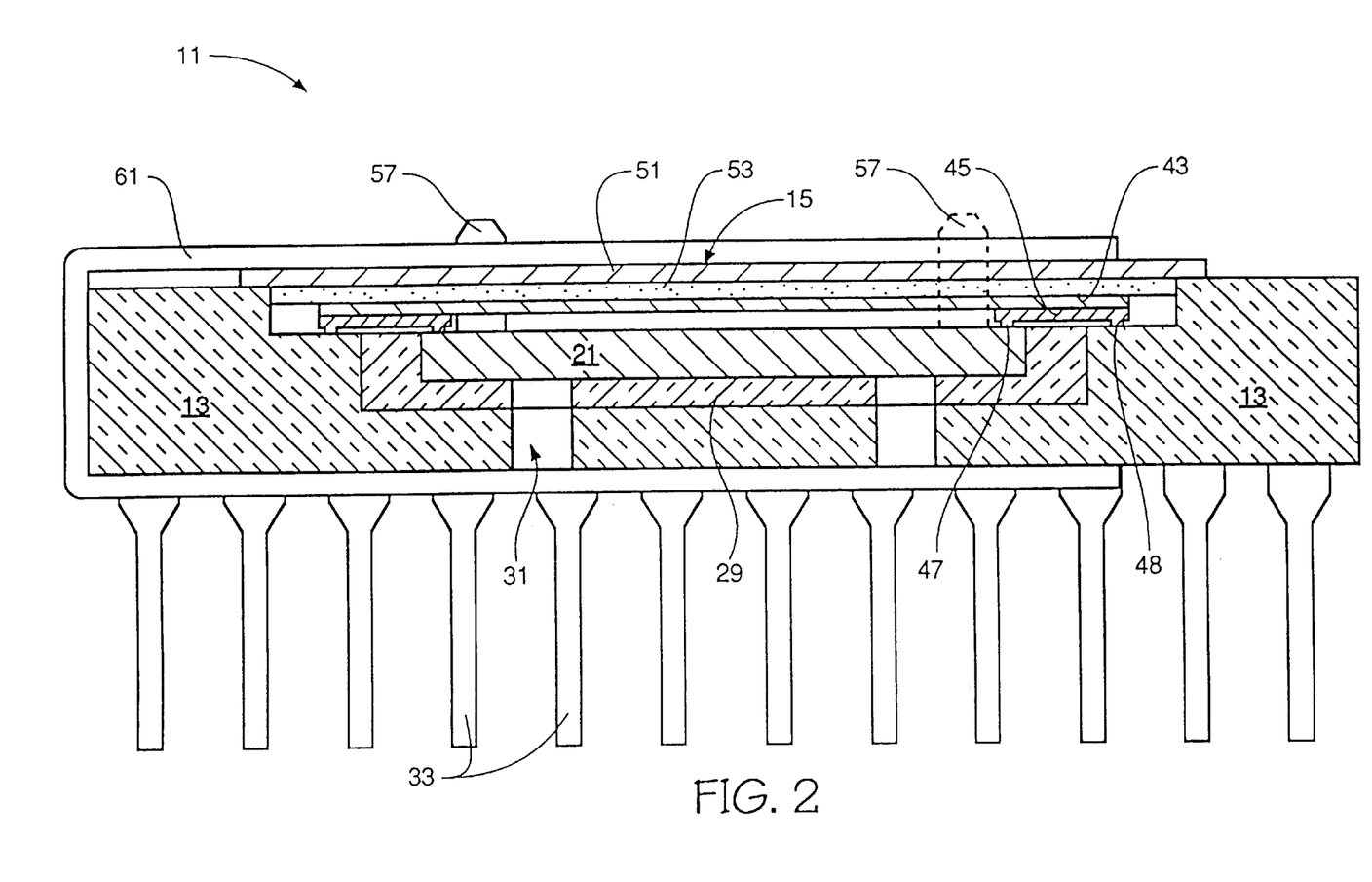

Referring to FIGS. 1 and 2, the inventive burn-in fixture 11 includes a die cavity plate, 13 and a cover 15. The die cavity plate 13 includes a die receiving cavity 17.

The die receiving cavity 17 has dimensions which are at least sufficient to accommodate a die 21. The die 21 is to be connected at bondpads 27, which are typically 0.1 mm wide. For this reason, it is advantageous to provide a spacer plate 29 which fits within the die receiving cavity 17 and the die 21, and which precisely positions the die 21 for subsequent alignment. The die cavity plate also has a slot 31 which permits convenient access to the bottom of the die 21 in order that the die 21 may be lifted out of the die receiving cavity 21.

A plurality of external connector leads 33 extend from the burn in fixture 11. As can be seen in FIG. 2, in the preferred embodiment, the external connector leads 33 are attached to the die cavity plate 13, and extend therefrom. The external connector leads 33 are shown as connector pins, which preferably are in a DIP (dual inline plug) or QFP (quad flat pack) configuration.

The external connector leads 33 are secured by the die cavity plate 13 and terminate on the die cavity plate 13 with contact pads 37. The contact pads 37 are in approximate planar alignment with the bondpads 27.

Figure 3:
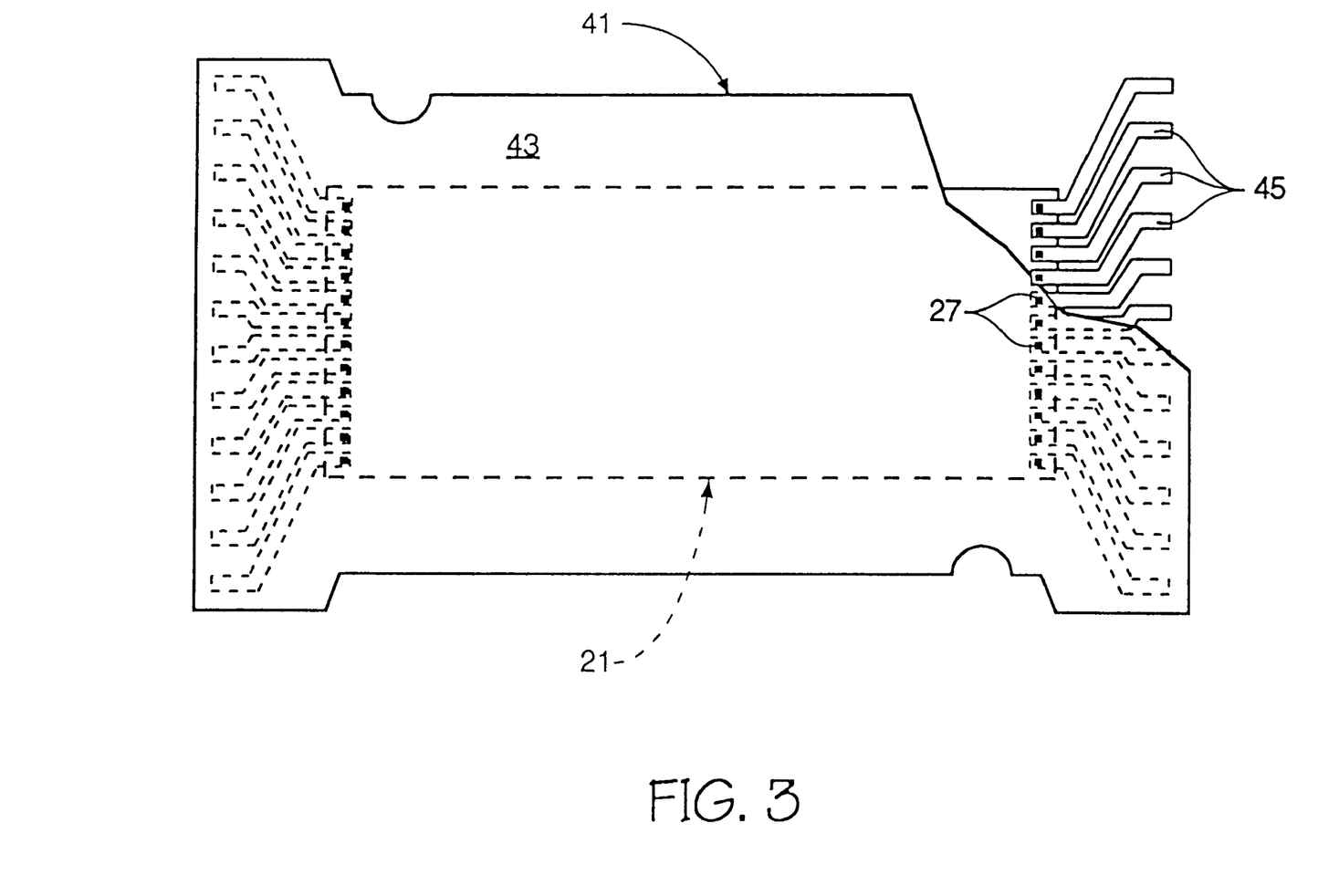
FIG. 3 shows details of non-bonded TAB tape used with the invention.

Referring to FIGS. 1 and 2, contact between the bondpads 27 and the external connector leads 33 is established by non-bonded TAB (tape automated bonding) tape 41, shown in FIG. 3.

The non-bonded TAB tape 41 is essentially similar to conventional TAB tape methods, except that its connection function may be performed without bonding the TAB tape 41 to the die 21. In order to maintain contact with the bondpads 27, the non-bonded TAB tape 41 is biased against the die 21 when the burn-in/test fixture 11 is assembled. This enables the non-bonded TAB tape 41 to be lifted from the die 21 without destroying the bondpads 27.

The non-bonded TAB tape 41 includes a plastic film 43, preferably formed of polyamide, onto which are formed a plurality of conductive traces 45. The conductive traces 45 have bumps 47, 48 which are intended for registration with a bondpad 27 or a contact pad 37. The conductive traces 45 therefore are able to conduct signals between the bondpads 27 and the contact pads 37.

It is possible to bond the TAB tape 41 to the bondpads 27, if such a bond could be made reversible. That would require that the bond be generally weaker than the attachment of the bondpad 27 to the die 21. This would necessitate a weak bond, or an other means to permit the die to be separated from the fixture 11.

It is also possible to permanently bond the TAB tape 41 to the die 21, and to retain the attachment to the TAB tape 41 to the die 21 subsequent to burn in.

The cover 15 includes a rigid cover plate 51 and a resilient compressible elastomeric strip 53, which serves as a biasing member 53. When the cover plate 51 is secured to the die cavity plate 13, the resilient biasing member 53 biases the non-bonded TAB tape 41 against the die 21. This establishes an ohmic contact between the bondpads 27 and the conductive traces on the non-bonded TAB tape 41, without the TAB tape 41 being bonded to the bondpads 27.

The non-bonded contact of the non-bonded TAB tape 41 applies primarily to the bondpads 27. Contact between the TAB tape 41 and the contact pads 37 on the fixture 11 may be effected by bonding techniques. Such bonding is not expected to deteriorate the fixture 11, even though the fixture is used multiple times. If bonding is used for such contact, then the conductive material from the TAB tape may remain with the fixture 11, but without detriment to the operation of the fixture 11.

Positioning pins 57 are used to align the cover plate 51 with the die cavity plate 13. A clamp 61 then secures the cover plate 51 in place over the die cavity plate 13. The clamp 61 may consist of a wire clasp which may either be latched into place against itself, as shown, or is fitted into parallel horizontal locations in the die cavity plate 13 and the cover plate 51. With the cover plate 51 in place, conductors on the non-bonded TAB tape 41 extend from the bondpads 27 to the contact pads 37, so that the bondpads 27 are in electrical communication with the external connector leads 33.

Figure 4:
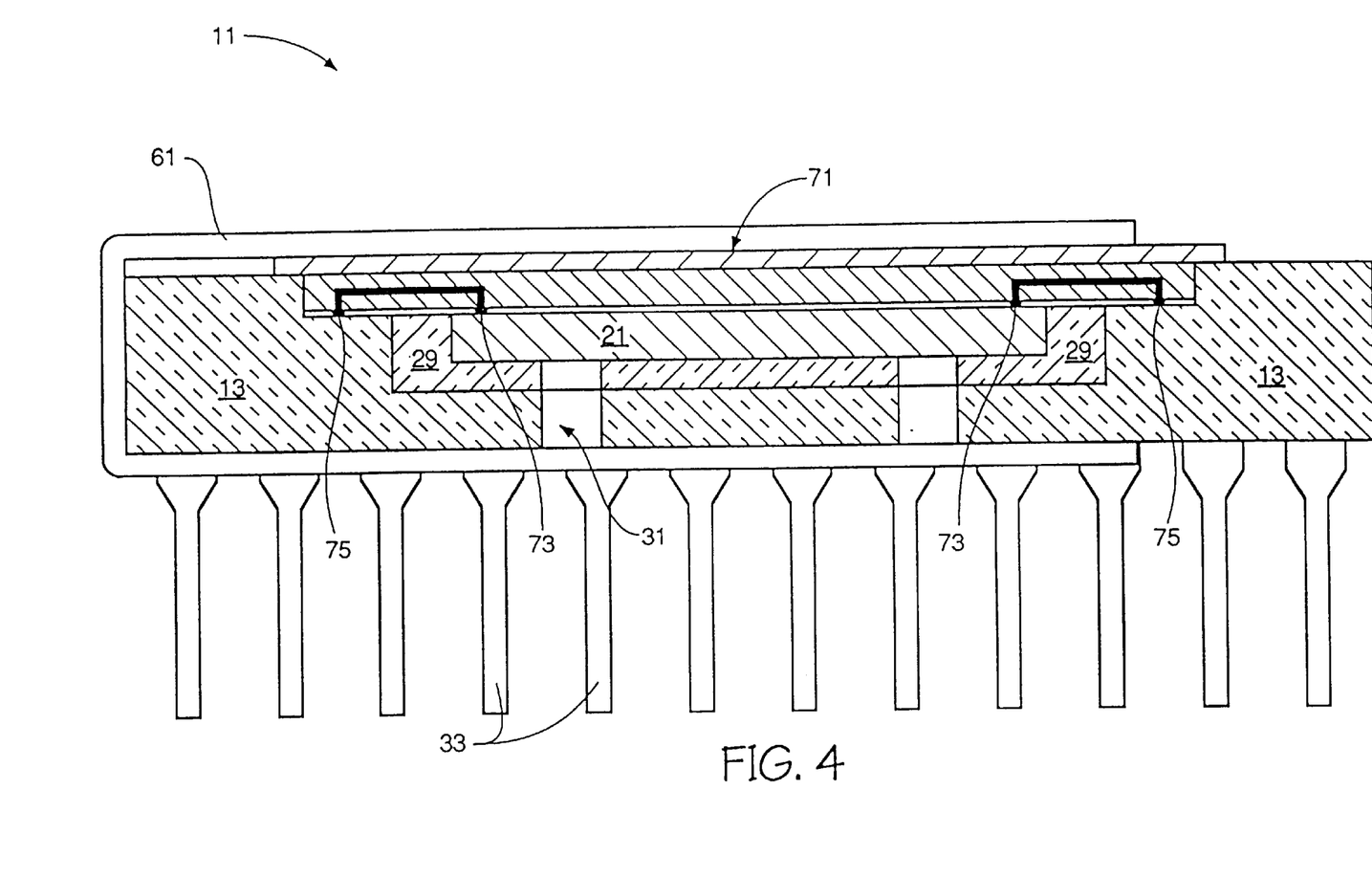
FIG. 4 shows a modification to the embodiment of FIGS. 1 and 2, in which a modified cover plate has conductive polymer contacts.

FIG. 4 shows a modification to the embodiment of FIGS. 1 and 2, in which a modified cover plate 71 uses conductive polymer contacts 73 in order to establish contact with the bondpads 27. Contact with the external connector leads 33 is established by electrical contacts 75 on the cover plate 71, and these contacts 75 may be either conductive polymer or metallic.

Figure 5:
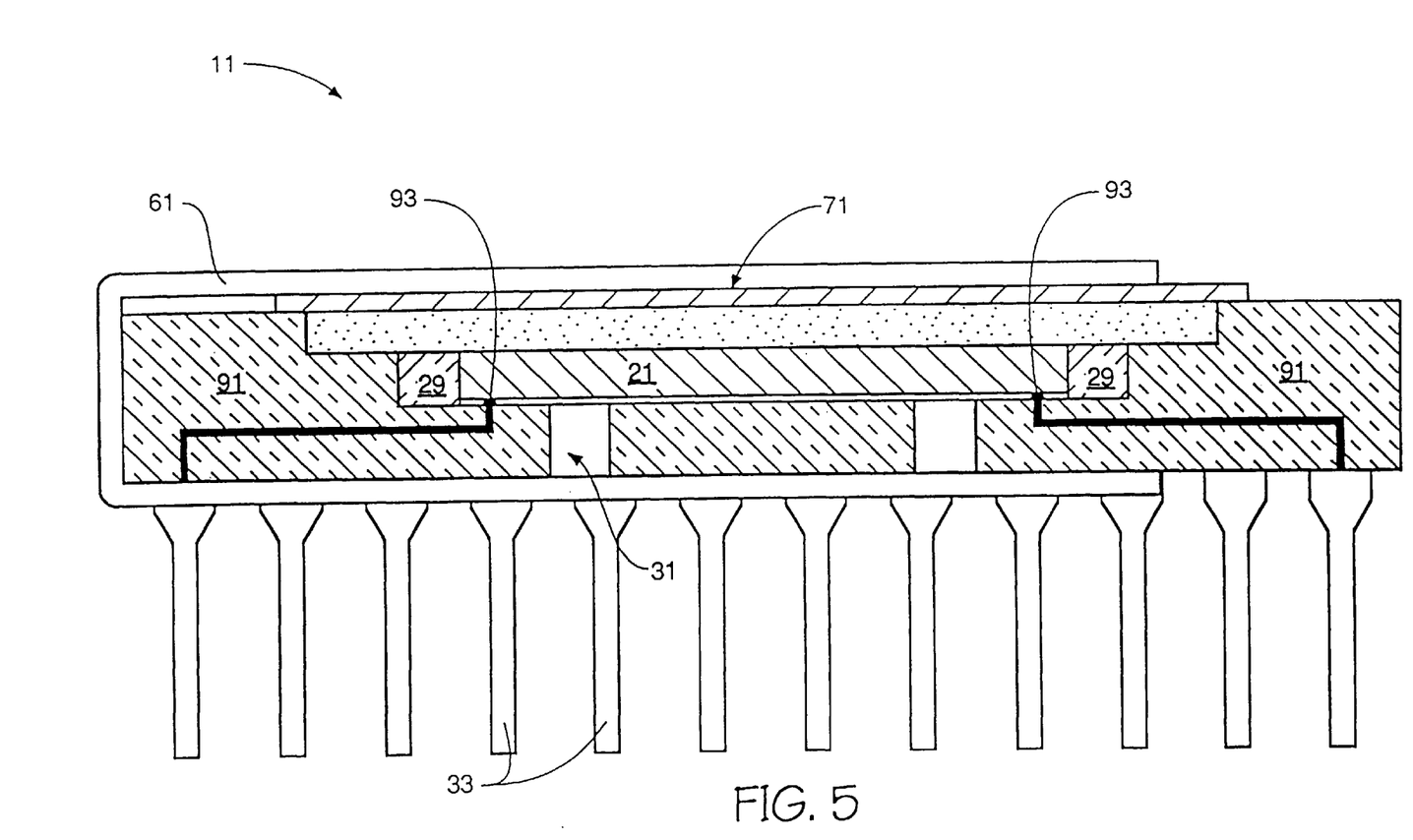
FIG. 5 shows an embodiment in which a die cavity housing is used for connections between the die and external connection pins.

FIG. 5 shows an embodiment in which a die cavity housing 91 has conductive polymer contacts 93. The die 21 is placed face down, so as to establish connect ion between the bondpads 27 and the polymer contacts 93.

Figure 6:
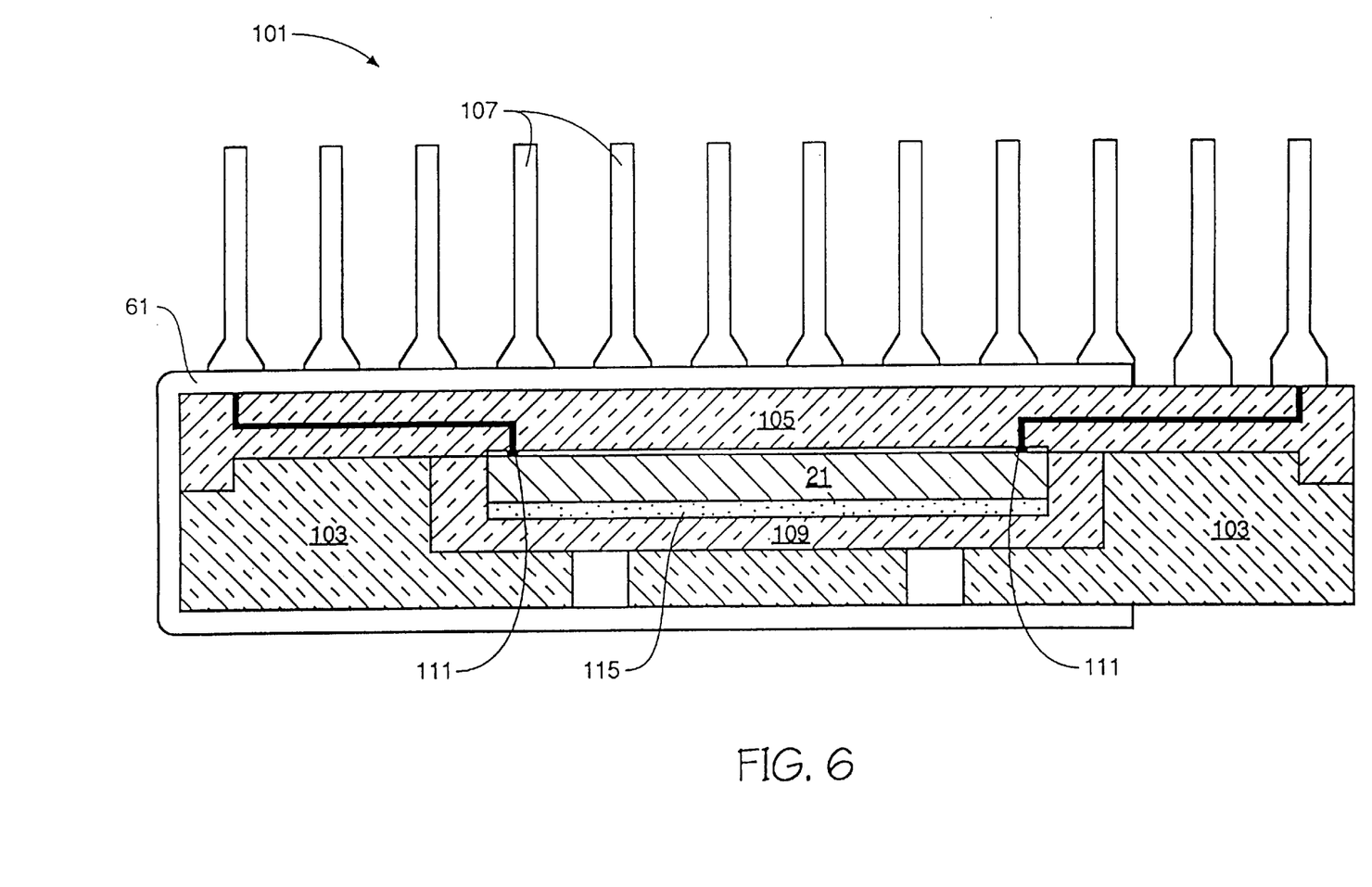
FIG. 6 shows an alternate embodiment of a test package, in which an upper portion is used to connect the die to external test circuitry.

In an alternate embodiment of a package 101, shown in FIG. 6, a die receiving housing 103 is used to retain a die 21, and an upper portion 105 is used to connect the die 21 to external test circuitry, by the use of external connector pins 107. The die receiving housing 103 contains a die receiving cavity 109, which supports the die 21 in alignment with electrical contacts 111 which contact bondpads 27 on the die 21. A biasing plate 115 biases the die 21 against the contacts 111. In one embodiment of this configuration, the contacts 111 are metallic, although other conductors may be used for the contacts 111. As an example, it is possible to use conductive polymer for the contacts 111.

Figure 7:
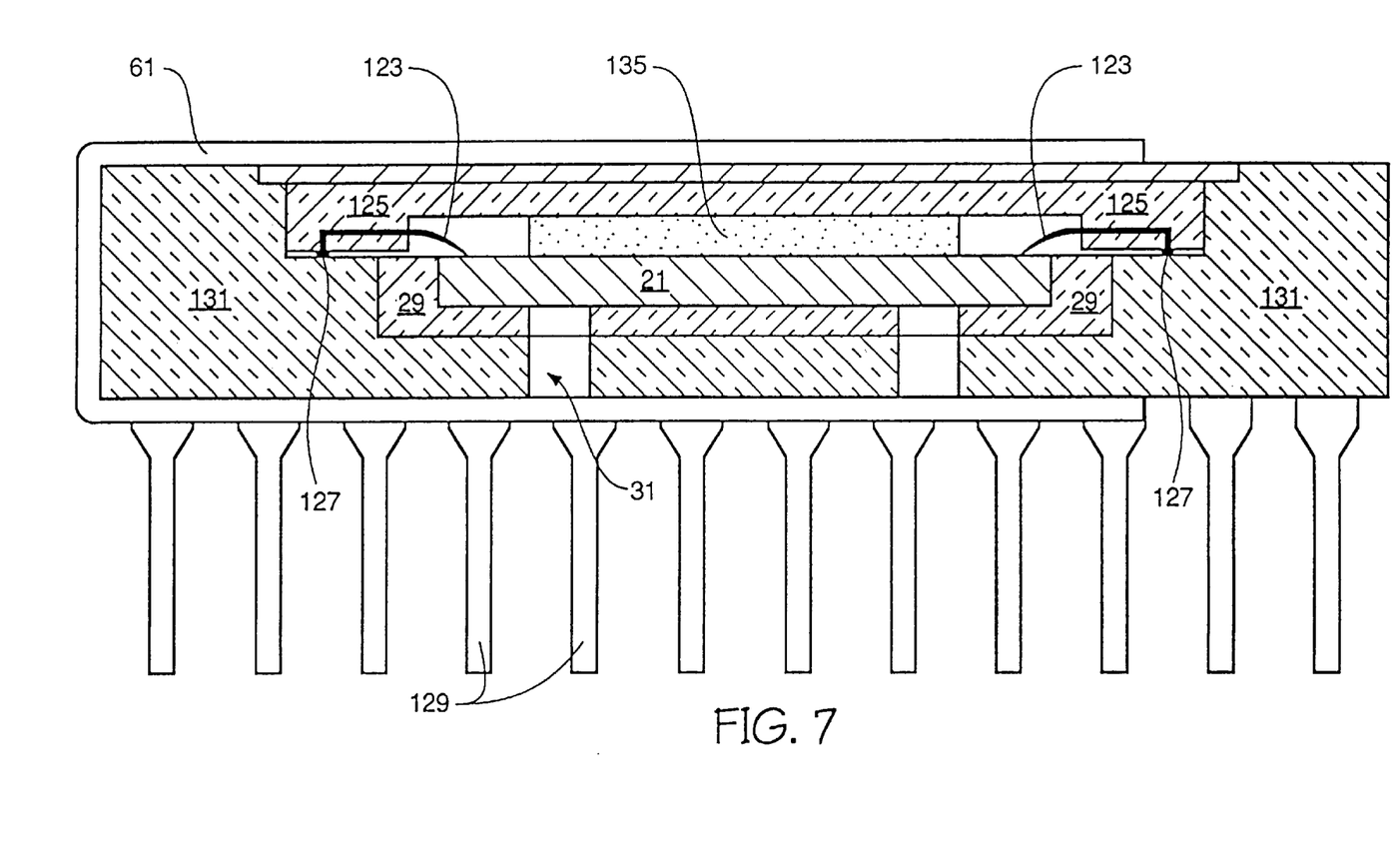
FIG. 7 shows a modification to the embodiment of FIGS. 1 and 2, in which contact pins are used for connections between the die and external connection pins.

In an embodiment shown in FIG. 7, contact pins 123 are used to connect to the bondpads 27 on the die 21. The contact pins 123 are mounted to a dielectric cover 125, and electrical continuity between the contact pins 123 and base portions 127 of external connector pins 129 is established when the cover 125 is mounted to a die cavity housing 131. A resilient pad 135 secures the die 21 in position in the housing 131.

The contacts 123 are pin type contacts, which are similar to probe contacts. Because of the relatively precise alignment of the cover 125 with respect to the die 21, it is possible to design the contacts 123 to have a relatively low biasing force, while still maintaining good ohmic contact between the bondpads 27 and the contacts 123.

Figure 8:
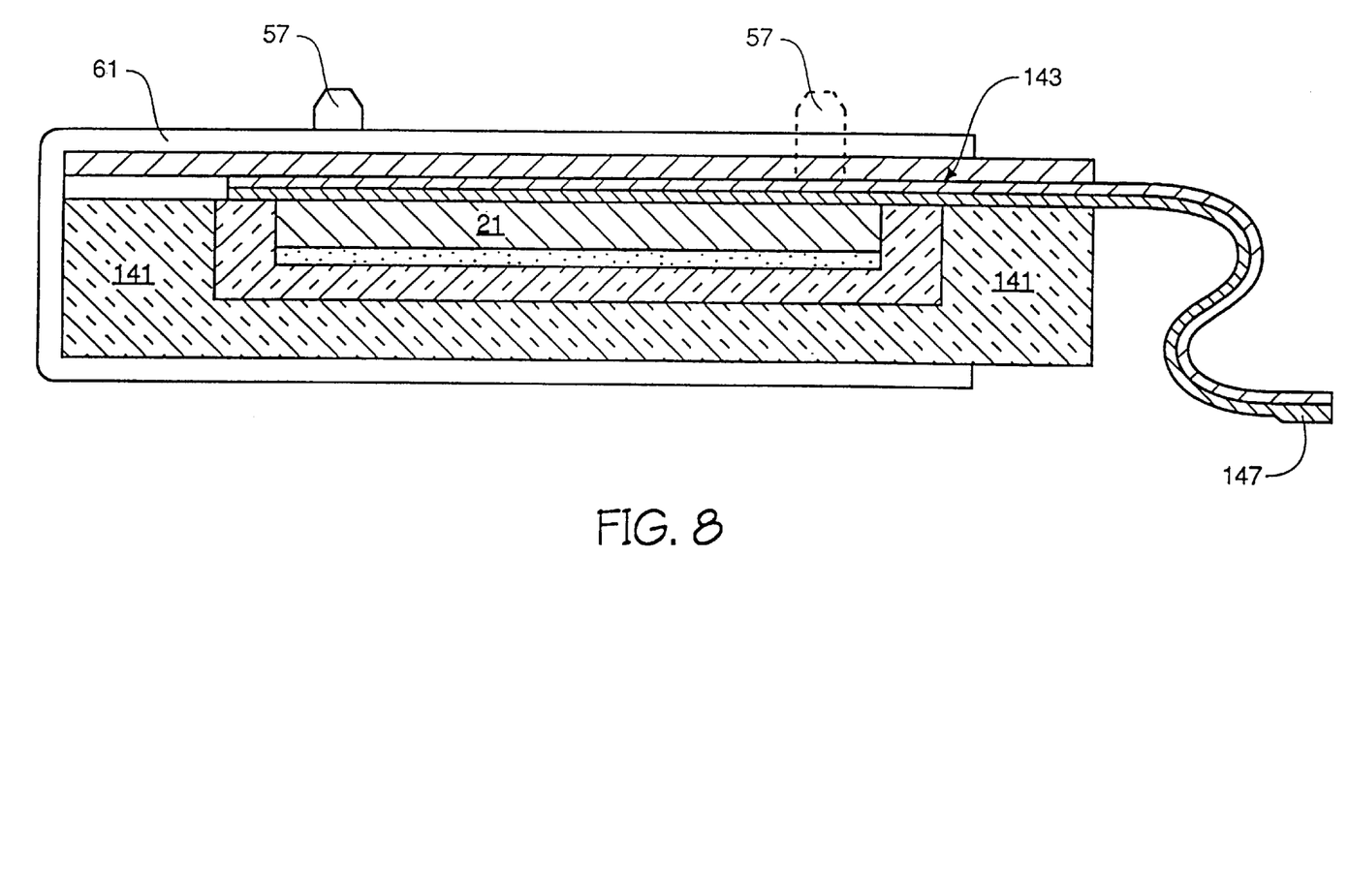
FIG. 8 shows a modification of the invention, in which flexible tape is used to directly connect the die to an external connector connected to external test circuitry.

FIG. 8 shows a configuration in which a housing fixture 141 merely retains the die 21 in a predetermined positional alignment, and in electrical communication with non-bonded TAB tape 143. The TAB tape 143 extends beyond the confines of the fixture 141 and terminates in an external connector 147.

While specific locations for bondpads had not been specified, it is possible to test a variety of configurations, including the conventional arrangement of bondpads at the ends of the die 21. The invention may also be used for testing die configured for LOC (leads over chip), as well as other designs. In each of the above examples, the assembled fixture is adapted into conventional test equipment, such as a burn-in oven. What has been described is a very specific configuration of a test fixture. Clearly, modification to the existing apparatus can be made within the scope of the invention. Accordingly, the invention should be read only as limited by the claims.

What is claimed is:

1. A method for testing a semiconductor die having a die contact comprising:

providing a test circuitry configured to generate test signals;

providing a test fixture comprising a first plate and a second plate configured to house the die, the first slate comprising a cavity for retaining the die, an external lead, and a contact in electrical communication with the external lead and in approximate planar alignment with the die contact with the die in the cavity;

providing a die contact member between the first plate and the second plate for electrically connecting the die contact to the external lead, the die contact member comprising a plastic film, a first bump on the film for electrically contacting the die contact, a conductive trace on the film in electrical communication with the first bump, and a second bump on the film in electrical communication with the conductive trace for electrically contacting the contact;

placing the die in the cavity and the second plate on the first elate with the die contact in electrical contact with the first bump, the contact in electrical contact with the second bump, and the external lead in electrical communication with the test circuitry; and applying the test signals through the external lead, the contact, the second bump, the conductive trace, the first bump, and the die contact to the die.

2. The method of claim 1 further comprising bonding the first bump to the die contact prior to the placing step to attach the member to the die.

3. The method of claim 2 wherein the first bump is bonded to the die contact with a reversible bond generally weaker than an attachment of the die contact to the die.

4. The method of claim 1 wherein the first plate comprises a slot in the cavity for removing the die following the applying step.

5. A method for testing a semiconductor die having a die contact comprising:

provide a test circuitry configured to generate test signals;

providing a test fixture comprising a first plate and a second plate configured to house the die, the first plate comprising a cavity for retaining the die, an external lead, and a slot in the cavity for removing the die;

providing a die contact member configured for placement between the first plate and the second plate for electrically connecting the die to the external lead, the die contact member comprising a plastic film, a bump on the film for electrically contacting the die contact, a conductive trace on the film in electrical communication with the bump and with the external lead;

providing a compressible member configured for placement between the first plate and the second plate to bias the die against the die contact member;

placing the die in the cavity with the die contact in electrical contact with the bump;

securing the second plate to the first plate with the compressible member compressed therebetween to bias the bump against the die contact;

placing the external lead in electrical communication with the test circuitry;

applying the test signals through the external lead, the conductive trace, the bump, and the die contact to the die; and following the applying step, removing the die using the slot.

6. The method of claim 5 further comprising bonding the bump to the die contact prior to the placing step.

7. The method of claim 5 wherein the bump comprises solder or a conductive polymer.

8. A method for testing a semiconductor die having a die contact comprising:

providing a test circuitry configured to generate test signals;

providing a test fixture comprising a first plate and a second plate configured to house the die, the first plate comprising an external lead connectable to the test circuitry;

providing a die contact member configured for placement between the first plate and the second plate to electrically connect the die to the external lead, the member comprising a plastic film, a bump on the film for electrically contacting the die contact, and a conductive trace on the film in electrical communication with the bump and electrically connectable to the external lead;

attaching the member to the die by bonding the bump to the die contact;

placing the die and the member in the test fixture between the first elate and the second plate with the conductive trace in electrical communication with the external lead and the external lead in electrical communication with the test circuitry;

applying the test signals through the external lead, the conductive trace, the bump, and the die contact to the die; and following the applying step removing the die with the member attached thereto from the test fixture.

9. The method of claim 8 wherein the bonding step comprises bonding the bump to the die contact with a reversible bond generally weaker than an attachment of the die contact to the die.

10. The method of claim 8 wherein the bump comprises solder or a conductive polymer.

* * * * *

UNITED STATES PATENT AND TRADEMARK OFFICE
CERTIFICATE OF CORRECTION

PATENT NO. : 6,091,251
DATED : July 18, 2000
INVENTOR(S) : Alan G. Wood, Tim J. Corbett, Gary L. Chadwick, Chender Huang, Larry D. Kinsman It is certified that error appears in the above-identified patent and that said Letters Patent is hereby corrected as shown below:

Column 6,
Line 37, change "slate" to -- plate --.
Line 53, change "elate" to -- plate --.

Signed and Sealed this

Fourteenth Day of August, 2001

*Attest:*

NICHOLAS P. GODICI
*Attesting Officer*     Acting Director of the United States Patent and Trademark Office

UNITED STATES PATENT AND TRADEMARK OFFICE
CERTIFICATE OF CORRECTION

PATENT NO.    : 6,091,251
DATED         : July 18, 2000
INVENTOR(S)   : Alan G. Wood, Tim J. Corbett, Gary L. Chadwick, Chender Huang and Larry D. Kinsman It is certified that error appears in the above-identified patent and that said Letters Patent is hereby corrected as shown below:

<u>Title page,</u>
Insert the following below Item [76], Inventors:

-- Item [73] Micron Technology, Inc., Boise ID (US) --

Signed and Sealed this

Twenty-eighth Day of May, 2002

*Attest:*

JAMES E. ROGAN
*Attesting Officer*    *Director of the United States Patent and Trademark Office*